US008665607B2

(12) United States Patent
Bouza, II et al.

(10) Patent No.: US 8,665,607 B2
(45) Date of Patent: Mar. 4, 2014

(54) ANTI-EAVESDROPPING DEVICE

(75) Inventors: Jose M. Bouza, II, Bumpass, VA (US); Salvador Aguirre, Jr., Arlington, VA (US); Daniel Ashley McDonnell, Silver Spring, MD (US); Timothy Wayne Eaton, Centreville, VA (US); Stephen Robert Woodruff, Elkridge, MD (US); Frank Augustine Mason, Arlington, VA (US)

(73) Assignee: Vector Technologies, LLC, Fairfax, VA (US)

( * ) Notice: Subject to any disclaimer, the term of this patent is extended or adjusted under 35 U.S.C. 154(b) by 0 days.

(21) Appl. No.: 13/478,857

(22) Filed: May 23, 2012

(65) Prior Publication Data

US 2013/0077799 A1 Mar. 28, 2013

Related U.S. Application Data

(62) Division of application No. 12/026,519, filed on Feb. 5, 2008, now Pat. No. 8,203,850.

(51) Int. Cl.
*H05K 7/14* (2006.01)
*H05K 7/18* (2006.01)

(52) U.S. Cl.
USPC .......................................... 361/800; 361/816

(58) Field of Classification Search
USPC .......... 361/799, 816, 818, 800; 174/35 R, 51, 174/100, 101, 355–365
See application file for complete search history.

(56) References Cited

U.S. PATENT DOCUMENTS

| | | | |
|---|---|---|---|
| 1,765,443 | A | 6/1930 | Peterson |
| 2,757,225 | A | 7/1956 | Dunn |
| 3,055,969 | A | 9/1963 | Schaller, Jr. |
| 3,213,199 | A | 10/1965 | Snow |
| 3,247,312 | A | 4/1966 | Alessi |
| 3,334,175 | A | 8/1967 | Vincent |
| 3,531,577 | A | 9/1970 | Garlington |
| 4,185,167 | A | 1/1980 | Cunningham et al. |
| 4,567,317 | A | 1/1986 | Ehrlich et al. |
| 4,691,483 | A | 9/1987 | Anderson |
| 4,761,921 | A | 8/1988 | Nelson |
| 4,829,729 | A | 5/1989 | Derner et al. |
| 4,972,469 | A | 11/1990 | Saltwick et al. |
| 4,980,516 | A | 12/1990 | Nakagawa |

(Continued)

FOREIGN PATENT DOCUMENTS

| | | | |
|---|---|---|---|
| CN | 2009-44923 | Y | 9/2007 |
| GB | 1549593 | A | 8/1979 |

(Continued)

OTHER PUBLICATIONS

McKinney, Jr., J.A., Your demand letter of Aug. 22, 2011 on pending U.S. Appl. No. 12/026,519, Aug. 25, 2011, pp. 5-6.

(Continued)

*Primary Examiner* — Hung S Bui
(74) *Attorney, Agent, or Firm* — Lowe Hauptman & Ham, LLP

(57) ABSTRACT

An anti-eavesdropping device is described. The device comprises a receiving compartment for receiving an electronic device, a noise generator, and an EMI filter. The receiving compartment is sealable to minimize signal emissions from the interior to the exterior and from the exterior to the interior, and the noise generator is coupled with the receiving compartment and the EMI filter. The EMI filter is operatively coupled with the noise generator.

11 Claims, 9 Drawing Sheets

(56) References Cited

U.S. PATENT DOCUMENTS

| | | | |
|---|---|---|---|
| 5,039,826 | A | 8/1991 | Newland |
| 5,136,119 | A | 8/1992 | Leyland |
| 5,177,785 | A | 1/1993 | Itani et al. |
| 5,194,691 | A | 3/1993 | McIlwraith |
| 5,197,098 | A | 3/1993 | Drapeau |
| 5,239,792 | A | 8/1993 | Avni |
| 5,243,648 | A | 9/1993 | Gilardi et al. |
| 5,444,778 | A | 8/1995 | Bucalo et al. |
| 5,454,037 | A | 9/1995 | Pacella |
| 5,545,844 | A | 8/1996 | Plummer, III et al. |
| 5,581,047 | A | 12/1996 | Lazaroff |
| 5,586,168 | A | 12/1996 | Bucalo et al. |
| 5,594,200 | A | 1/1997 | Ramsey |
| 6,087,952 | A | 7/2000 | Prabhakaran |
| 6,188,771 | B1 | 2/2001 | Horrall |
| 6,195,529 | B1 | 2/2001 | Linz et al. |
| 6,272,226 | B1 | 8/2001 | Khan et al. |
| 6,377,038 | B1 | 4/2002 | Boswell et al. |
| 6,393,254 | B1 | 5/2002 | Pousada Carballo et al. |
| 6,469,495 | B1 | 10/2002 | Boswell et al. |
| 6,545,459 | B2 | 4/2003 | Boswell et al. |
| 6,563,297 | B1 | 5/2003 | Boswell et al. |
| 6,580,372 | B1 | 6/2003 | Harris |
| 6,657,214 | B1 | 12/2003 | Foegelle et al. |
| 6,798,887 | B1 | 9/2004 | Andre |
| 7,065,655 | B1 | 6/2006 | Jakobsson |
| 7,075,798 | B2 | 7/2006 | Hendrickson |
| 7,202,798 | B2 | 4/2007 | Harris |
| 7,302,234 | B1 | 11/2007 | Fessler et al. |
| 7,342,184 | B2 | 3/2008 | Cochrane |
| 7,388,160 | B2 | 6/2008 | Mok et al. |
| 7,512,430 | B2 | 3/2009 | Nakamura |
| 7,601,921 | B2 | 10/2009 | Schroader |
| 7,709,749 | B2 | 5/2010 | Meier |
| 2002/0175099 | A1 | 11/2002 | Wu |
| 2003/0057131 | A1 | 3/2003 | Diaferia |
| 2004/0183547 | A1 | 9/2004 | Kildal |
| 2005/0028999 | A1 | 2/2005 | Leu et al. |
| 2005/0092504 | A1 | 5/2005 | Walthall et al. |
| 2006/0260838 | A1 | 11/2006 | Ariel |
| 2007/0034406 | A1 | 2/2007 | Schroader |
| 2007/0142103 | A1 | 6/2007 | Livne |

FOREIGN PATENT DOCUMENTS

| | | | |
|---|---|---|---|
| JP | 2004-329818 | A | 11/2004 |
| JP | 2009-164265 | A | 7/2009 |
| JP | 2009-224446 | A | 10/2009 |
| WO | 99-44321 | A2 | 9/1999 |

OTHER PUBLICATIONS

Information Disclosure Statement filed by Randy A. Noranbrock on Aug. 31, 2011.

ANTI-EAVESDROPPING DEVICE

RELATED APPLICATIONS

The present application is based on, and claims priority from, U.S. application Ser. No. 12/026,519, filed Feb. 5, 2008, the disclosure of which is hereby incorporated by reference herein in its entirety.

BACKGROUND

Many portable electronic devices today contain relatively high fidelity microphones, high resolution cameras and multiple types of radio frequency transmission capabilities.

DESCRIPTION OF THE DRAWINGS

One or more embodiments is illustrated by way of example, and not by limitation, in the figures of the accompanying drawings, wherein elements having the same reference numeral designations represent like elements throughout and wherein.

DETAILED DESCRIPTION

Figure 1:
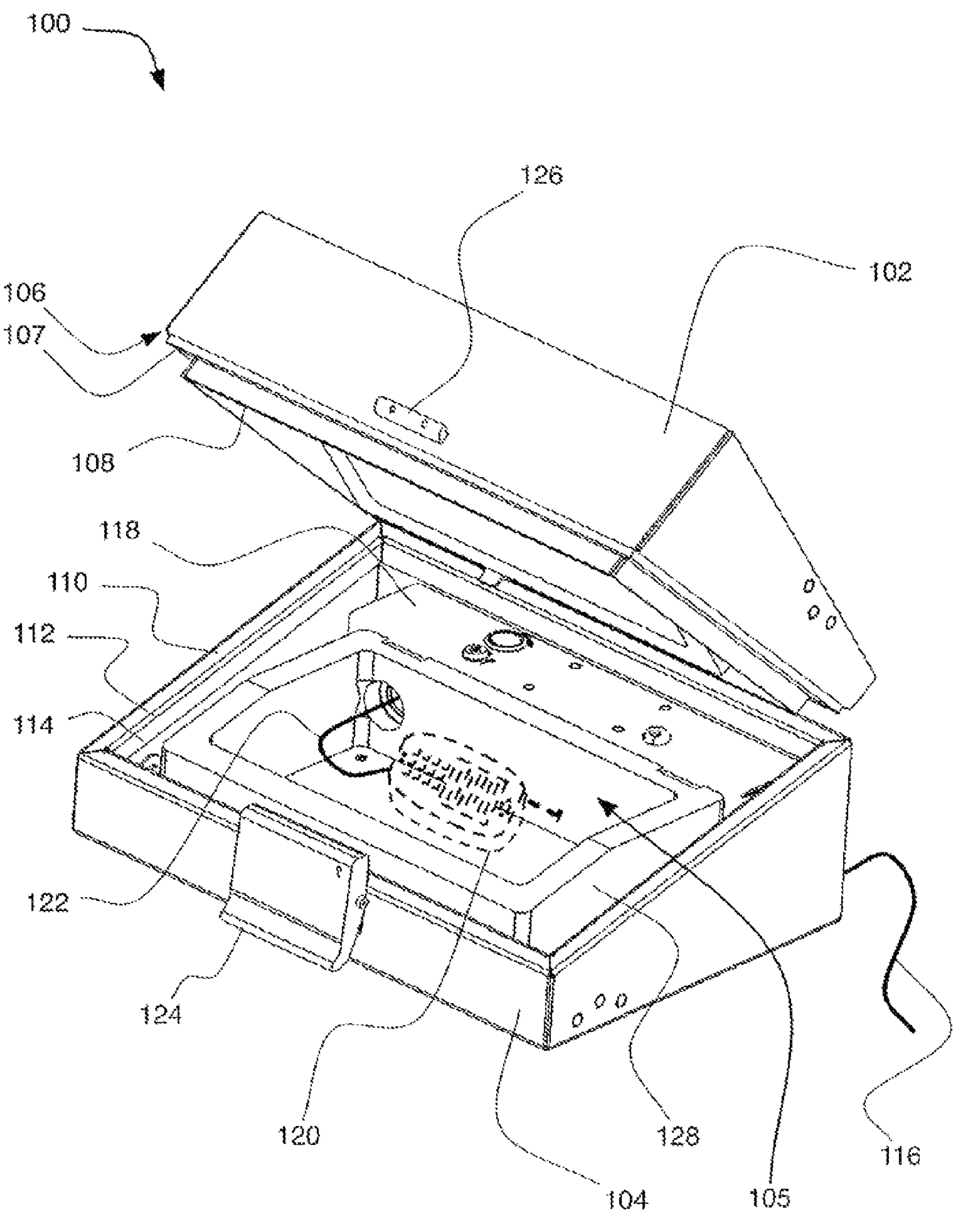
FIG. 1 is a perspective view of an anti-eavesdropping device according to an embodiment.

FIG. 1 depicts a perspective view of an anti-eavesdropping device 100 according to an embodiment. Device 100 comprises a top portion (or lid) 102 movably coupled with a bottom portion (or base) 104 thereby forming a receiving compartment 105 for receiving an electronic device. In at least some embodiments, a hinge connects top portion 102 with bottom portion 104. Top portion 102 and bottom portion 104 are each comprised of a signal blocking material. In at least some embodiments, the signal blocking material prevents and/or minimizes the transmission of acoustic and/or electromagnetic signals from the exterior of device 100 to the interior. In at least some embodiments, the signal blocking material prevents and/or minimizes the transmission of acoustic and/or electromagnetic signals from the interior to the exterior.

Lid 102 forms a parallelepiped having at least one face substantially open to the interior of the lid, i.e., lid forms a five-sided box having a sixth open end. In at least some embodiments, lid 102 may be formed of other shapes having more or less number of sides and/or non-parallel sides. In at least some embodiments, lid 102 is formed by bending a metal or alloy-based material to form an open-ended box. In at least some embodiments, lid 102 comprises a 0.093 gauge thick aluminum alloy 5052-H32. In at least some embodiments, lid 102 comprises an electrically conductive material.

Along the perimeter of the open end of lid 102, the lid is bent inward to form a return flange 106. Along the perimeter of return flange 106, lid 102 is bent away from the opening to form a knife edge 108. Knife edge 108 forms a contact point for contacting a corresponding perimeter piece attached to base 104. In at least some embodiments, the corresponding perimeter piece may be formed as an integrated part of base 104. After 102 is formed, the lid may be welded or otherwise constructed, e.g., extrusion, etc. to ensure an electromagnetic interference (EMI) seal. In at least some embodiments (and as depicted in FIG. 1), an EMI gasket 107 is affixed to return flange 106. EMI gasket 107 may comprise an electrically conductive material. In at least some embodiments, lid 102 may be painted in areas where no EMI gasket 107 makes contact.

Similar to lid 102, base 104 forms a parallelepiped having at least one face substantially open to the interior of the base, i.e., the base forms a five-sided box having a sixth open end. In at least some embodiments, base 104 may be formed of other shapes having more or less number of sides and/or non-parallel sides. In at least some embodiments, base 104 is formed by bending a metal or alloy-based material to form an open-ended box. In at least some embodiments, base 104 comprises a 0.093 gauge thick aluminum alloy 5052-H32. In at least some embodiments, base 104 comprises an electrically conductive material.

Further similar to lid 102, along the perimeter of the open end of base 104, the base is bent inward to form a return flange 110. Along the perimeter of return flange 110, base 104 is bent toward the bottom of the base to form a knife edge 112. EMI finger stock 114 is attached along knife edge 112 for contacting knife edge 108 of lid 102. In at least some embodiments, finger stock 114 may be formed as an integrated part of base 104. After base 104 is formed, the base is welded or otherwise constructed to ensure an EMI seal. Base 104 may be painted in areas where no EMI gasket 107 makes contact. In at least some embodiments, return flange 110 may comprise an EMI gasket affixed thereto.

In at least some embodiments, device 100 is 15.50 inches wide, 10.25 inches deep and 8.50 inches tall when fully assembled, i.e., lid 102 closed against base 104 with knife edge 108 inserted into contact with finger stock 114. In at least some embodiments, device 100 weighs 15.25 pounds.

A power adapter (transformer) external to device 100 is configured to supply one or more predetermined levels of power, e.g., current and/or voltage levels, to the device. The power adapter receives power, i.e., current, via a power source and transmits power to device 100 by way of power cable 116.

In at least some embodiments, the power adapter transforms an alternating current (AC) input of 100-240 Volts AC (VAC) at 1.6 Amps, 50/60 Hz to a single +12 Volts direct current (VDC) output at 5 Amps. The transformed power is supplied to generation and suppression unit 118 positioned in the interior of device 100. In at least some embodiments, unit 118 incorporates a transformer as an integrated portion inside device 100. In at least one embodiment with an integrated transformer, power cable 116 may be eliminated.

Unit 118 is arranged to supply power (current) to at least one electronic device 120 positioned inside device 100 and electrically coupled via a charging connector 122 to the unit to receive charging power. In at least some embodiments, device 100 is arranged to accommodate more than one electronic device 120 within the interior and unit 118 is arranged to supply a charging current to more than one electronic device 120. In at least some further embodiments, unit 118 may be arranged to supply a charging current to the number of electronic devices 120 accommodated in the interior of device 100. Electronic device 120 may comprise an electronic device having a microphone and/or speaker (transducer) and a recording and/or a transmitting capability. In at least some embodiments, electronic device 120 may comprise a personal digital assistant, a cellular or other wireless telephonic device, a digital and/or analog recorder, etc. Charging connector 122 is configured to supply a charging current to electronic device 120 and may be configured for one or more particular electronic devices.

In at least some embodiments, lid 102 is biased with respect to base 104 to remain in an open position. In accordance with these embodiments, device 100 further comprises a latch assembly comprising a latch 124 attached to base 104 and biased to a closed position, e.g., through the use of a coil spring to provide torque to keep the latch in a closed position. A corresponding catch 126 is mounted on lid 102 for engaging with latch 124. In at least some embodiments, latch 124 may be constructed of 6061-T6 aluminum alloy. In at least some embodiments, catch 126 may be constructed of 303 stainless steel. In operation, as lid 102 is moved downward toward base 104, the lid interfaces with catch 126. Catch 126 urges latch 124 away from lid 102. After catch 126 clears a leading edge of latch 124, the latch returns to the closed position and the catch is secured via an undercut in the latch.

FIG. 1 further depicts a lower portion of an isolation material 128 positioned within base 104 for receiving electronic device 120 and further isolating the device from audio signals from exterior of device 100. In at least some embodiments, isolation material 128 may comprise a foam or other cushioning material to protect electronic device 120, e.g., a cross-linked polyethylene foam.

Figure 1A:
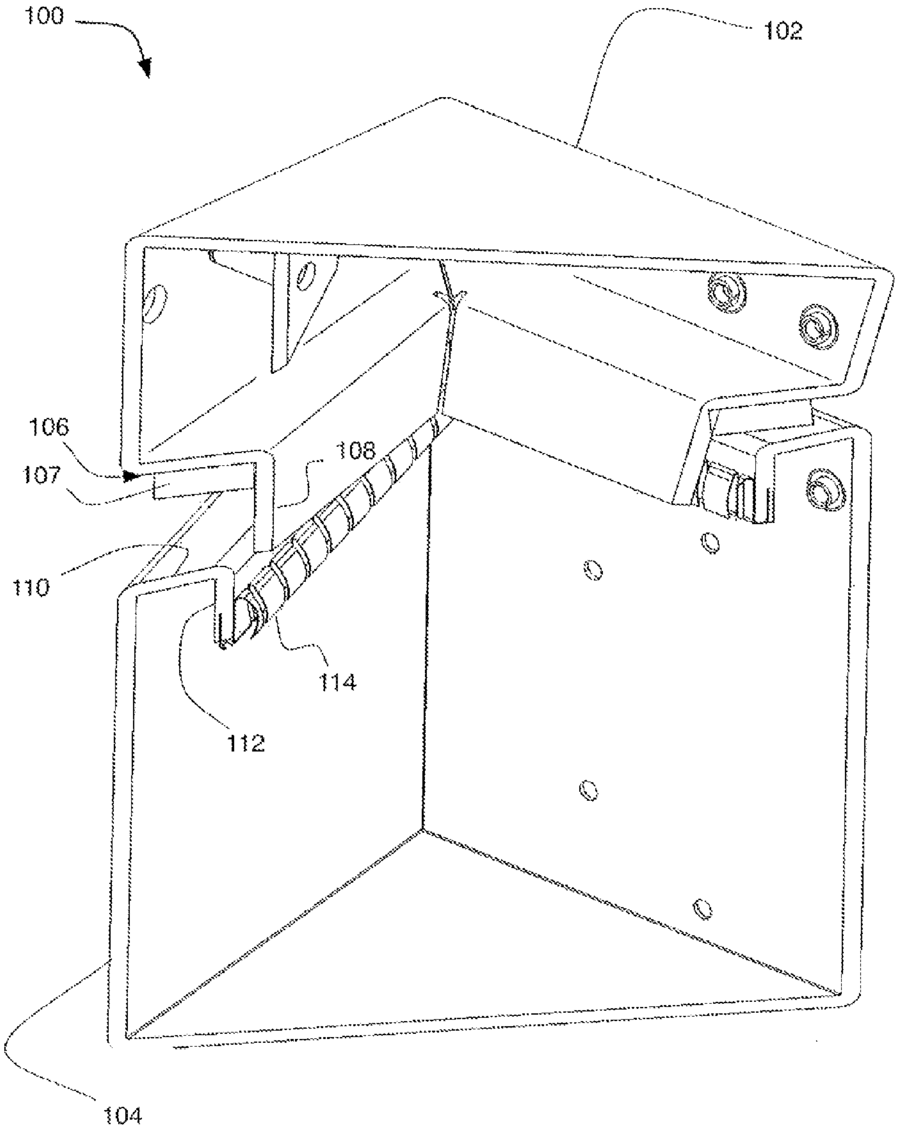
FIG. 1A is a detailed perspective view of a portion of the anti-eavesdropping device of FIG. 1.

FIG. 1A depicts an enlarged view of a portion of device 100 in a slightly open configuration. FIG. 1A depicts lid 102 in a partially-open configuration depicting EMI gasket 107 affixed to a surface of return flange 106 of the lid. FIG. 1A also depicts knife edge 108 of lid 102 contacting a portion of finger stock 114 affixed to knife edge 112 of base 104. In at least some other embodiments, finger stock 114 may comprise one or more different configurations comprising greater or fewer numbers of finger for contact with knife edge 108 of lid 102. In at least some other embodiments, finger stock 114 may be attached to knife edge 108 of lid 102.

Figure 2:
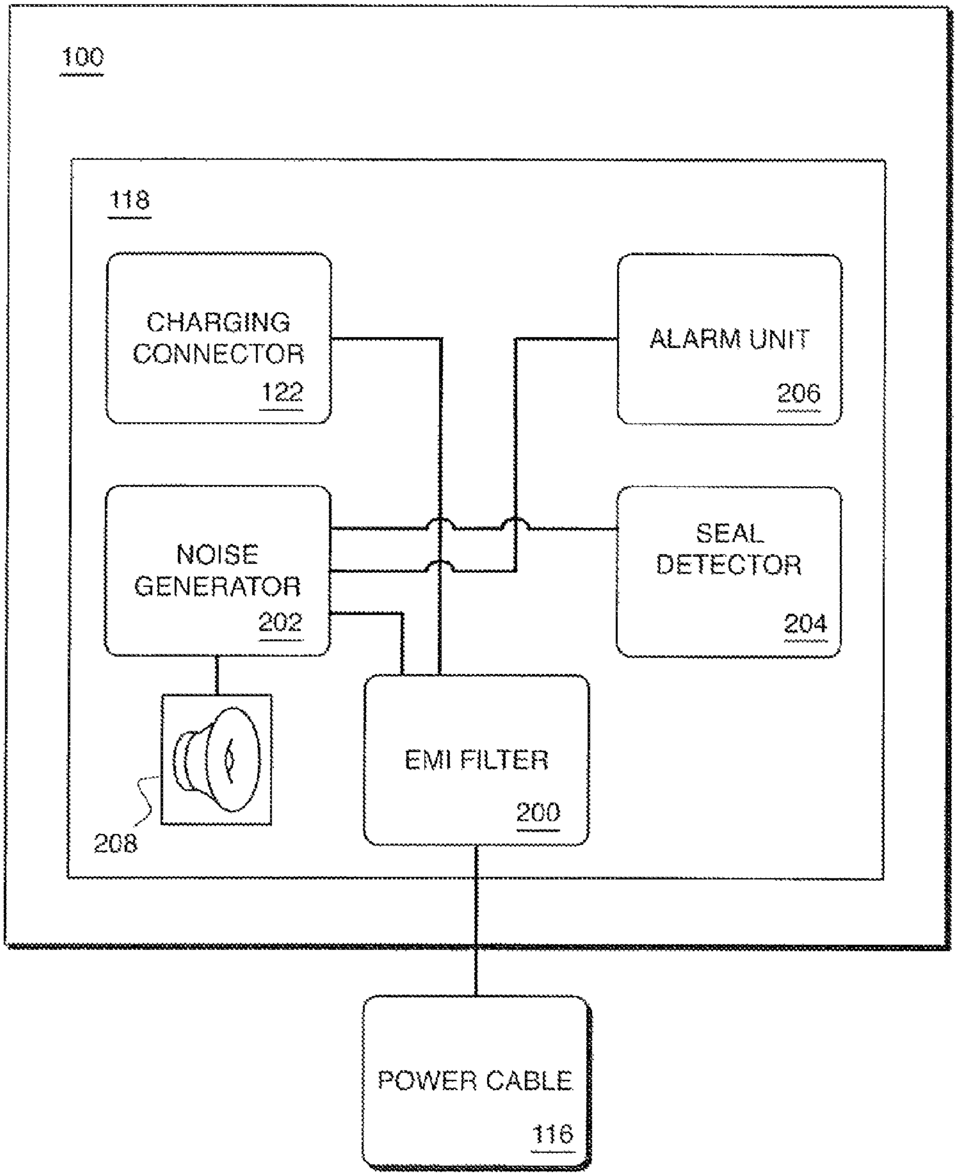
FIG. 2 is a high-level functional block diagram of an anti-eavesdropping device according to an embodiment.

FIG. 2 depicts a high-level functional block diagram of at least a portion of generation and suppression unit 118 of device 100 according to an embodiment in which the unit comprises an electromagnetic interference (EMI) filter 200 (electromagnetic signal filter), a noise generator 202, charging connector 122, a seal detector 204, an alarm unit 206, and a speaker 208.

EMI filter 200 electrically couples the power supplied to unit 118 and the components thereof and to the remaining components of device 100 via power cable 116 and filters the received power signal to permit selected frequency ranges to be communicated to/from device 100. In at least some embodiments, EMI filter 200 blocks frequencies other than those permitted ranges, e.g., the EMI filter blocks all frequencies other than the permitted frequencies. In at least some embodiments, EMI filter 200 is attached, i.e., grounded, to one or the other of lid 102 or base 104 to keep unwanted emissions from going into or out of device 100. EMI filter 200 may be used to only permit selected frequency ranges through to the interior of device 100 and block out all other frequencies. In at least some other embodiments, EMI filter 200 prevents the transmission of predetermined frequencies from the interior to the exterior of device 100. In at least some embodiments, EMI filter 200 comprises at least two filters: one filter for positive voltage levels and one filter for negative voltage levels.

In at least some other embodiments, EMI filter 200 is positioned external of unit 118 and internal of device 100 and electrically coupled to the generation and suppression unit. In still further embodiments, EMI filter 200 may be positioned external of or partially external of device 100 and electrically coupled to unit 118.

Noise generator 202 generates audio noise signals to the interior of device 100 via one or more audio transducers, i.e., speaker 208. Noise generator 202 generates audio noise via speaker 208 to prevent an electronic device positioned within receiving compartment 105 from recording audio signals originating exterior of device 100. In at least some embodiments, noise generator 202 is a random noise generator (e.g., a pink or white noise generator) which uses the random thermal electronic noise of a semiconductor p-n junction as the source for the random noise. The electronic noise signal is then filtered and amplified for transmission by speaker 208.

In at least some embodiments, device 100 and/or unit 118 may comprise one or more speakers 208 positioned within the interior of the device. In at least some embodiments, speaker 208 may be positioned in lid 102 and/or base 104 and be driven to a sufficient level to provide a masking noise signal to internally positioned electronic devices in device 100 in a closed position. Speaker 208 may be positioned in lid 102 toward the center above a predetermined location in which one or more electronic devices may be positioned.

In at least some embodiments, the noise signal delivered to speaker 208 has a maximum amplitude of +4 dBm at approximately 630 Hertz (Hz), and a flatness of +/−0.5 dB from 87 Hz to 4 kHz. The lower corner frequency (−3 dB point) of the emission band is at approximately 47 Hz, and the upper corner frequency (−3 dB point) is at approximately 8 kHz according to at least some embodiments. At the limits of the human hearing range 20 Hz-20 kHz, the signal amplitudes are −5.5 dBm and −4.7 dBm, respectively.

In at least some embodiments, generation and suppression unit 118 also comprises seal detector 204 which comprises a switch mechanism arranged in conjunction with lid 102 to detect closure of the lid of device 100, i.e., seal detector indicates that the device is in a closed position. Seal detector 204 may be electrically coupled with noise generator 202 to receive power for operation. Seal detector 204 is cooperatively coupled with noise generator 202 to transmit a signal indicating the closure state of device 100. After detection of device 100 in closed position, seal detector 204 transmits a signal to noise generator 202 to cause activation of the noise generator to generate the noise signal via speaker 208.

In at least some embodiments, seal detector 204 comprises a part of lid 102 and/or base 104 exterior to unit 118. In at least some embodiments, the switch mechanism of seal detector 204 may comprise a tab attached to or formed as a part of lid 102 which contacts a switch upon closure of device 100. In at least some embodiments, the switch mechanism may comprise electrical, optical, mechanical, or other manner of detecting closure of device 100. In at least some other embodiments, upon detection of opening of device 100, seal detector 204 transmits a signal to noise generator 202 to cause termination of charging current supply to charging connector 122 via EMI filter 200.

Generation and suppression unit 118 also comprises alarm unit 206 electrically and communicatively coupled to noise generator 202. Alarm unit 206 comprises a timer to determine whether device 100 has been left in an open state for a predetermined period of time. For example, if alarm unit 206 fails to receive a signal from seal detector 204 (via noise generator 202) within the predetermined period of time indicating closure of device 100, the alarm unit generates an alarm. After the predetermined period of time has been reached, alarm unit 206 generates an alarm to indicate that device 100 has remained in an open state for an excessive amount of time. Alarm unit 206 may generate an audible and/or visual alarm signal. In at least some embodiments, alarm unit 206 may be directly coupled with speaker 208 to cause the speaker to generate the audible alarm signal. In at least some embodiments, alarm unit 206 may form part of noise generator 202.

In at least some embodiments, the timer comprises a series of capacitors charged at a predetermined rate based on power received from EMI filter 200. After the capacitors reach a saturation point, the excess voltage is transmitted to the alarm, and the alarm sounds, e.g., the excess voltage may be transmitted to speaker 208.

In at least some embodiments, alarm unit 206, and seal detector 204 may be electrically coupled with EMI filter 200 and communicatively coupled with noise generator 202.

Figure 3:
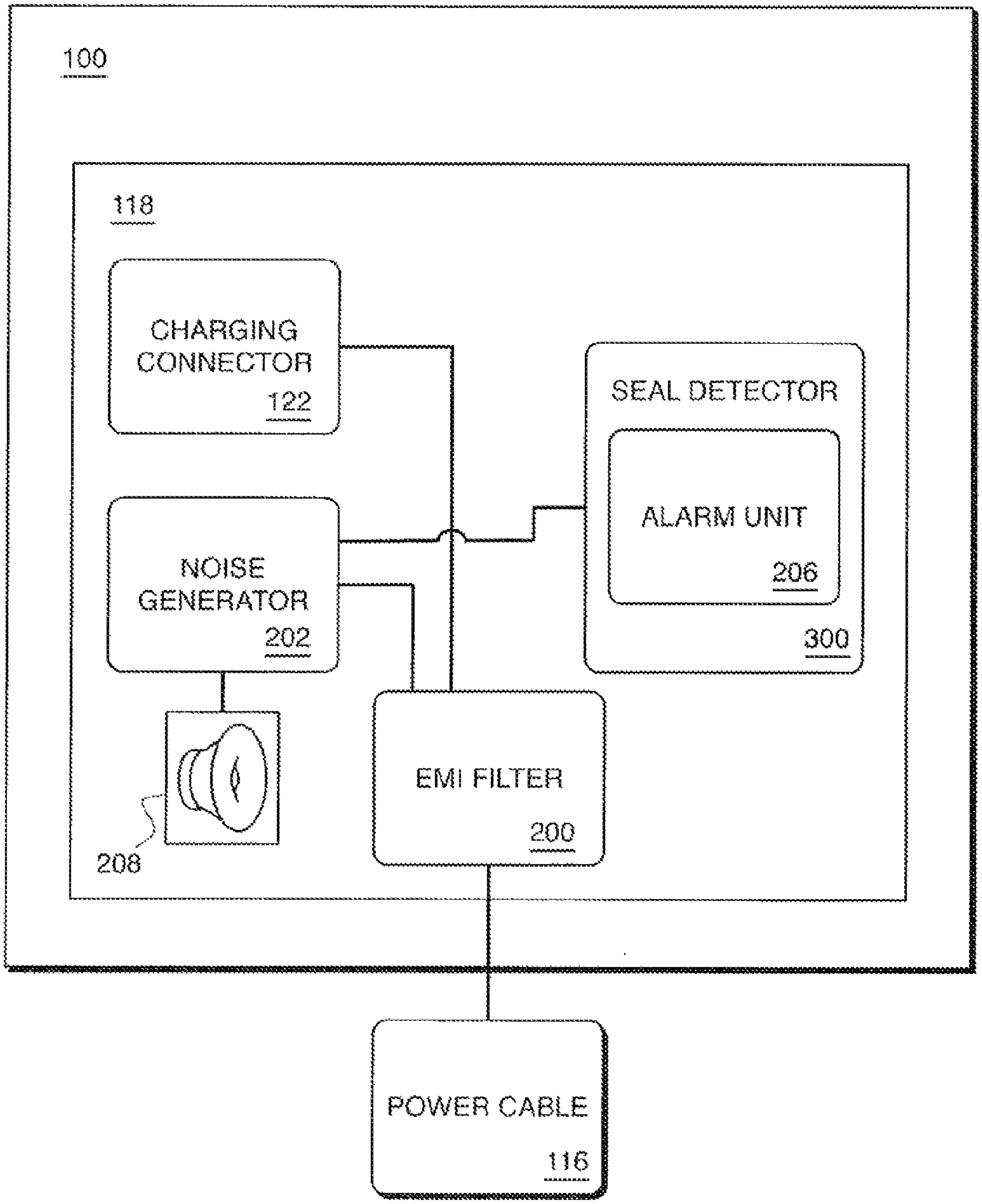
FIG. 3 is a high-level functional block diagram of an anti-eavesdropping device according to another embodiment.

FIG. 3 depicts another embodiment of device 100 wherein unit 118 comprises EMI filter 200, noise generator 202, charging connector 122, speaker 208, and a seal detector 300 similar to the seal detector of FIG. 2. Seal detector 300, however, comprises alarm unit 206 as a part of the seal detector.

Figure 4:
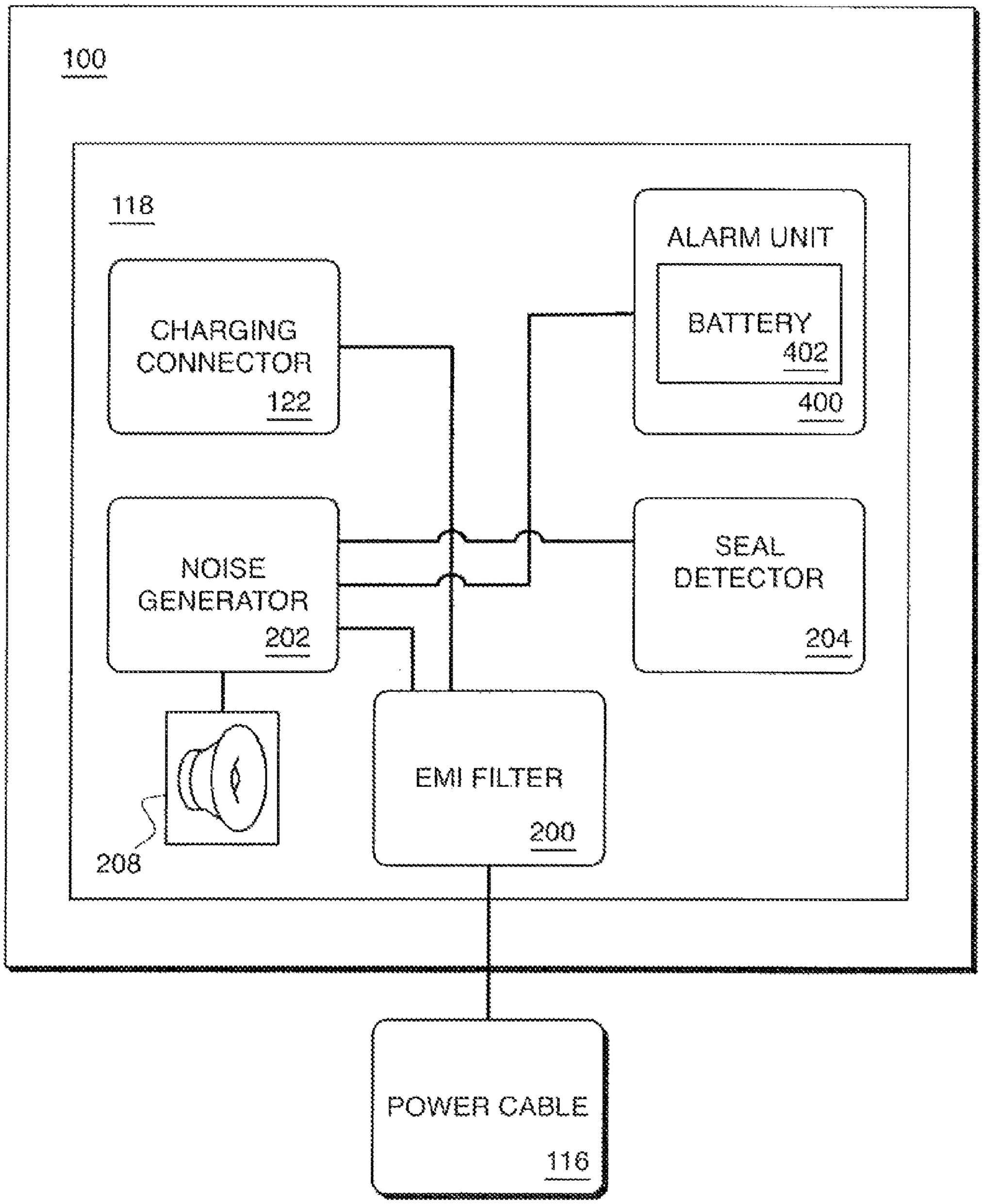
FIG. 4 is a high-level functional block diagram of an anti-eavesdropping device according to another embodiment.

FIG. 4 depicts another embodiment of device 100 wherein unit 118 comprises EMI filter 200, noise generator 202, charging connector 122, speaker 208, seal detector 204, and an alarm unit 400 similar to the alarm unit of FIG. 2. Alarm unit 400, however, comprises a battery 402 in order to enable operation of alarm unit for a predetermined period of time after loss of power from EMI filter 200 to the alarm unit. In this manner, alarm unit 400 may operate to indicate an alarm based upon loss of power to device 100 and/or loss of power to noise generator 202. In operation, alarm unit 400 monitors the power supply from EMI filter 200 (via noise generator 202) and, based upon a determination of loss of power from the EMI filter, causes the generation of an alarm signal. In at least some embodiments, the alarm signal may be generated by alarm unit 400, a speaker (e.g., speaker 208) or other signal generator integrated as part of alarm unit, or a speaker or other signal generator external to device 100.

Figure 5:
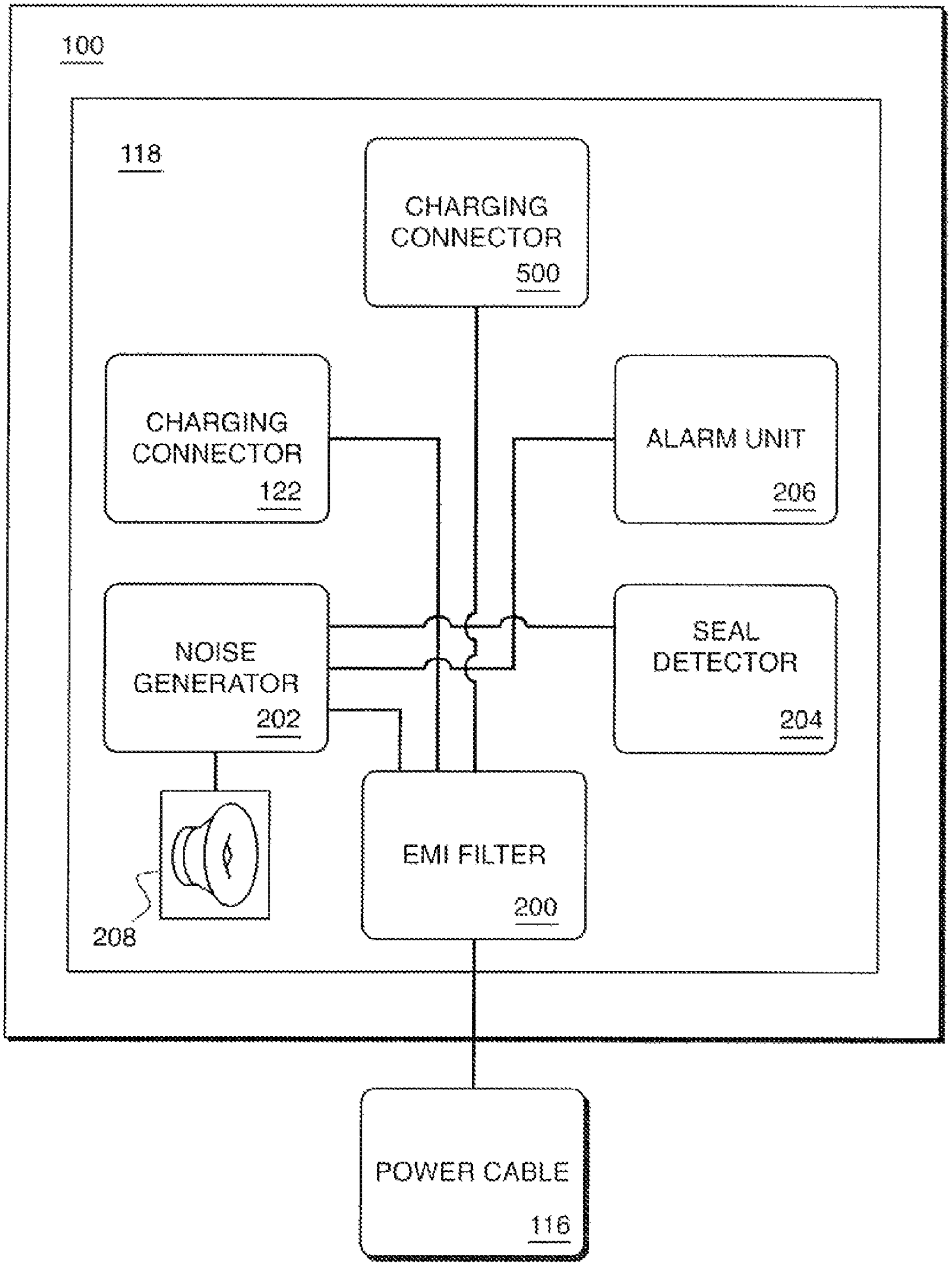
FIG. 5 is a high-level functional block diagram of an anti-eavesdropping device according to another embodiment.

FIG. 5 depicts another embodiment of device 100 further comprising an additional charging connector 500 connected with EMI filter 200. In at least some embodiments, more than two charging connectors may be connected with EMI filter 200 in order to supply charging power to electronic devices inside device 100.

Figure 6:
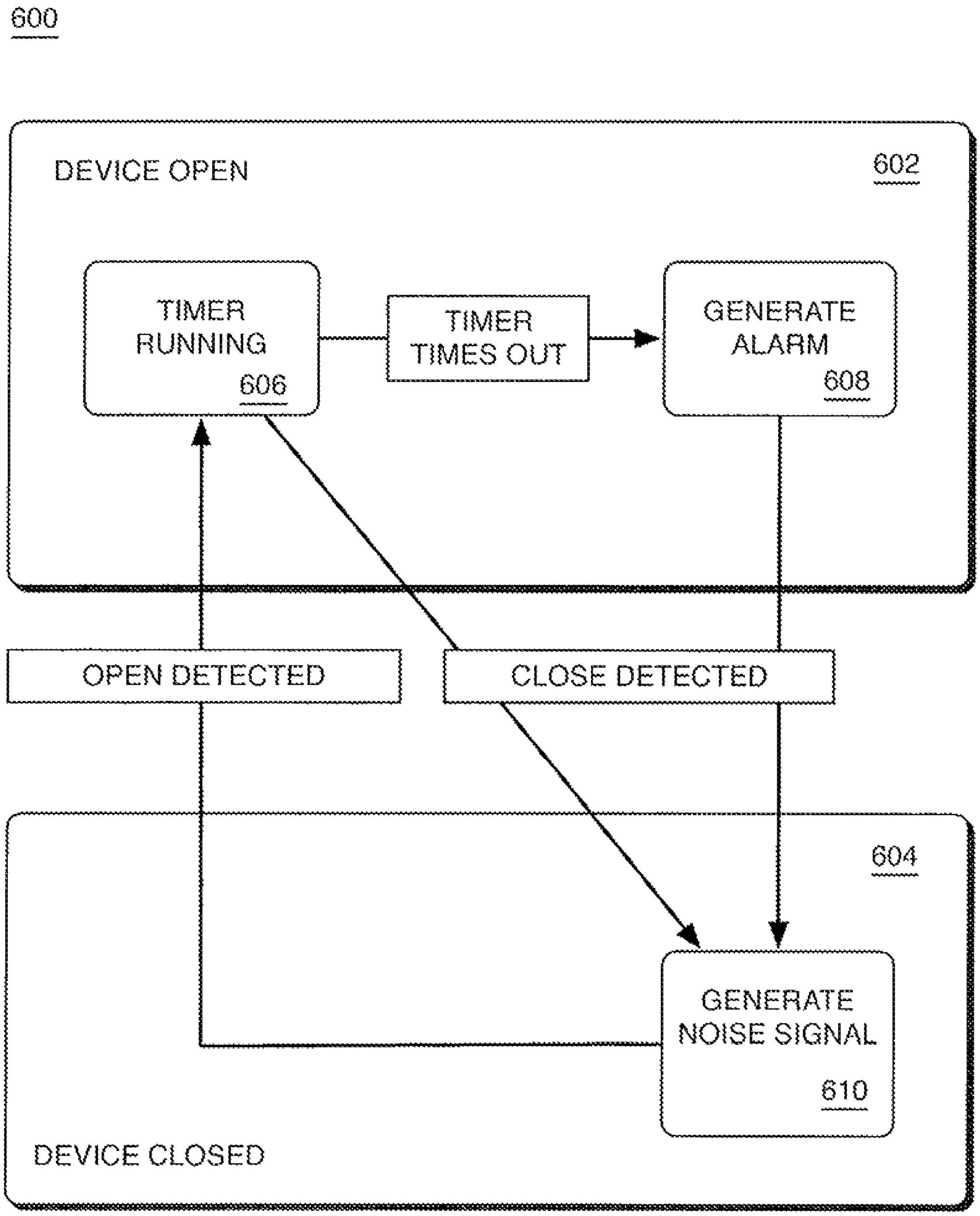
FIG. 6 is a high-level process flow diagram of a portion of operation of an anti-eavesdropping device according to an embodiment.

FIG. 6 depicts a high-level process flow of at least a portion 600 of operation of device 100 according to an embodiment. In at least some embodiments, portion 600 may comprise a set of instructions to be executed by noise generator 202. In at least some other embodiments, portion 600 may comprise a set of instructions to be executed by a controller or other processor or logic device of device 100. The set of instructions may be stored in volatile and/or non-volatile memory comprising a part of device 100. At device open state 602, device 100 is in an open state available to receive an electronic device. At device closed state 604, device 100 is in a closed state and noise generator 202 is operating to generate a noise signal.

Given an initial operating state of device 100 in an open state 602, the flow begins at timer running functionality 606 and a timer is counting a period of time during which the device is in the open state. An electronic device is placed within the interior of the device in open state 602.

After a predetermined period of time has elapsed, the timer times out and the flow proceeds to generate alarm functionality 608 and device 100 generates an alarm signal to indicate to a user that the device has been open for longer than the predetermined amount of time. If a user then closes device 100, the flow proceeds to device closed state 604 and generate noise signal functionality 610 operates to cause the generation of the noise signal interior to the device. As described above, the device closed state 604 may be detected by seal detector 204 (FIG. 2).

If, however, the predetermined period of time has not elapsed and device 100 is closed, the flow transitions to device closed state 604 and generate noise signal functionality 610 operates to cause the generation of a noise signal interior to the device. As described above, the device closed state 604 may be detected by seal detector 204 (FIG. 2).

After transitioning to the device closed state 604, if the device is opened, e.g., as detected by seal detector 204 (FIG. 2), the flow proceeds to device open state 602 and the timer is restarted in timer running functionality 606.

Figure 7:
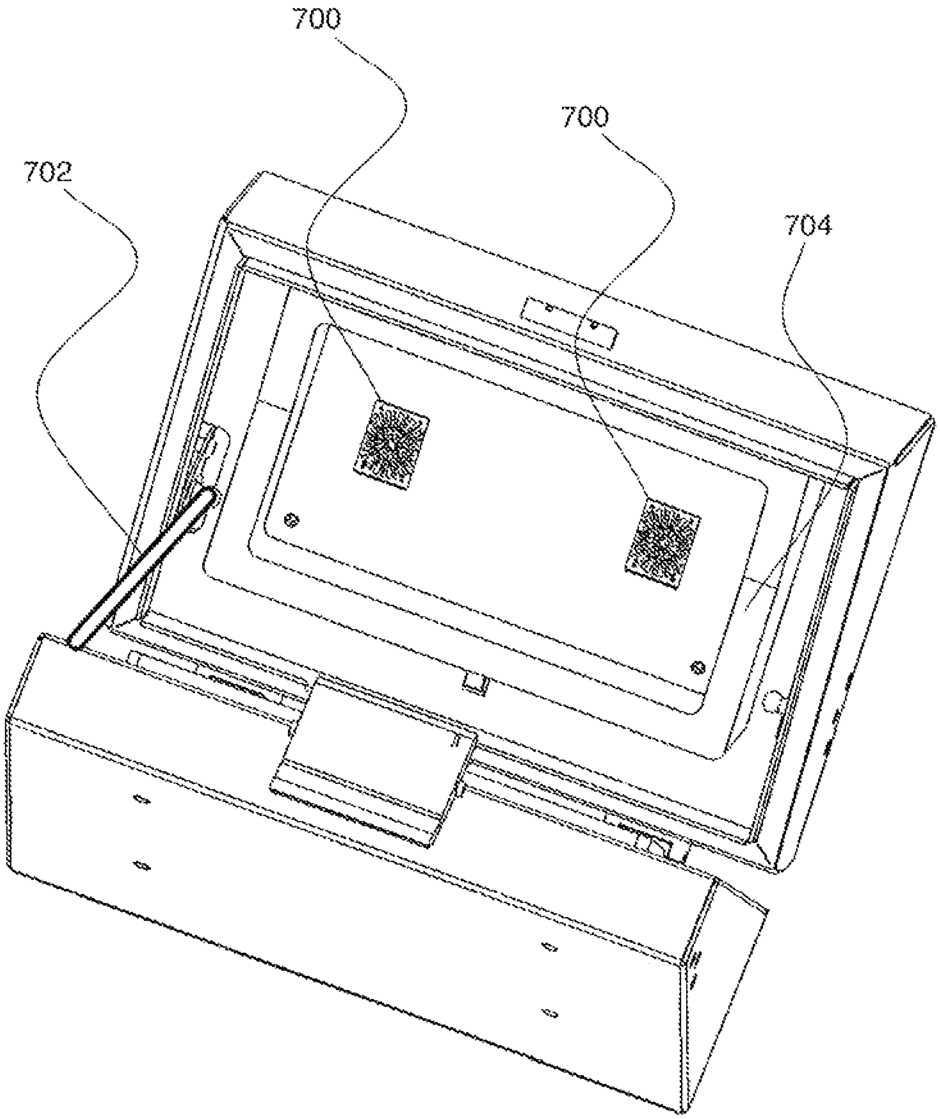
FIG. 7 is a perspective view of an anti-eavesdropping device according to an embodiment.

FIG. 7 depicts another perspective view of device 100 according to an embodiment. FIG. 7 depicts a pair of speakers 700 (similar to speaker 208) mounted in lid 102 of device 100. As depicted, FIG. 7 also depicts a piston 702 biased to nominally maintain device 100 in an open position. Piston 702 is mounted at one end to lid 102 and at the other end to base 104. In at least some embodiments, device 100 comprises more than one piston and more or less numbers of speakers.

FIG. 7 also depicts an upper portion of an isolation material 704 positioned within lid 102 for receiving electronic device 120 and further isolating the device from audio signals from exterior of device 100. Upper portion 704 and lower portion 128 (FIG. 1) are constructed to form an enclosing unit after device 100 is in a closed state.

Figure 8:
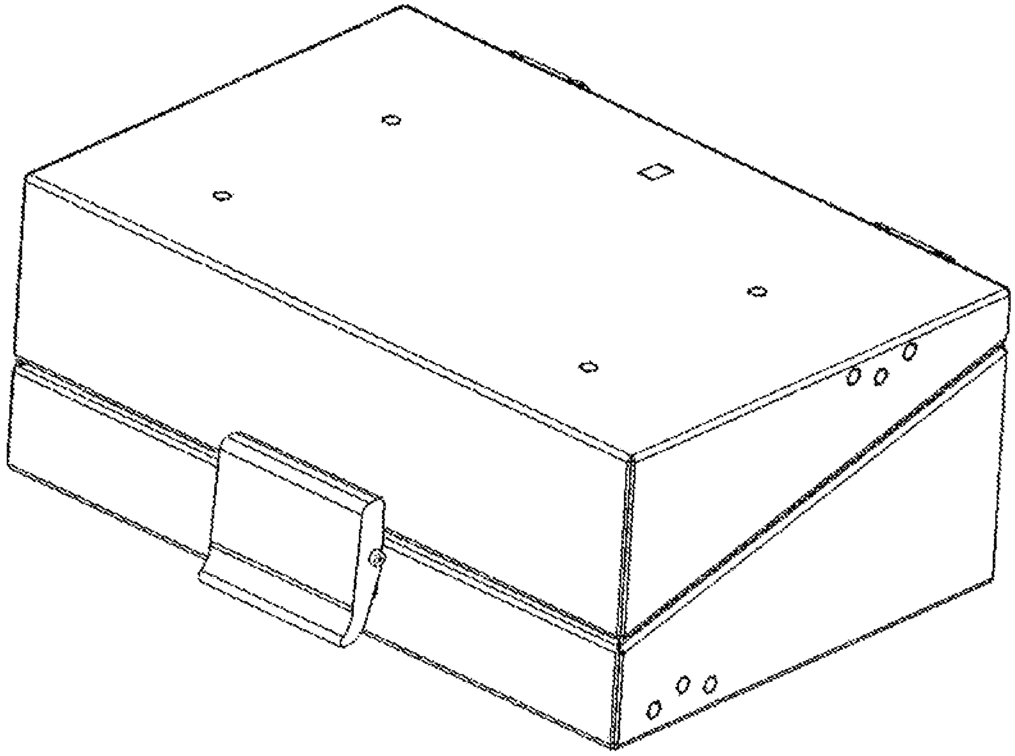
FIG. 8 is a perspective view of an anti-eavesdropping device according to an embodiment in a closed state.

FIG. 8 depicts another perspective view of device 100 according to an embodiment in a closed state. Latch 124 is caught on catch 126 maintaining device 100 closed, e.g., against the normally open action of piston 702 (FIG. 7).

What is claimed is:

1. A method of operation of an anti-eavesdropping device, the anti-eavesdropping device being constructed of materials to minimize transmission of electromagnetic and/or audio signals from an exterior of the device to an interior of the device and from the interior of the device to the exterior of the device after the device is in a closed state, the method comprising:

generating a noise signal in the interior of the device to minimize reception of at least one of an audio signal or an electromagnetic signal from an exterior of the device to an interior of the device after the device is in a closed state;

generating a noise signal in the interior of the device to minimize transmission of at least one of an audio signal or an electromagnetic signal from an interior of the device to an exterior of the device after the device is in a closed state; and supplying power to an electronic device in an interior of the device during a period when the device is in a closed state.

2. The method of claim 1, further comprising:

supplying power to the electronic device in an interior of the device during a period when the device is in an open state.

3. The method of claim 1, further comprising:

generating an alarm signal indicating that the device is in an open state during a period when the device is in an open state.

4. The method of claim 3, wherein the generation of the alarm signal occurs after the device has been in an open state for a predetermined period of time.

5. A method of operation of an anti-eavesdropping device, the anti-eavesdropping device being constructed of materials to minimize transmission of electromagnetic and/or audio signals from an exterior of the device to an interior of the device and from the interior of the device to the exterior of the device after the device is in a closed state, the method comprising:

generating a noise signal in the interior of the device to minimize reception of at least one of an audio signal or an electromagnetic signal from an exterior of the device to an interior of the device after the device is in a closed state;

supplying power to a portable electronic device in an interior of the device during a period when the device is in a closed state; and generating an alarm signal indicating that the device is in an open state during a period when the device is in an open state.

6. The method of claim 5, further comprising:

supplying power to the portable electronic device in an interior of the device during a period when the device is in an open state.

7. The method of claim 5, wherein the generation of the alarm signal occurs after the device has been in an open state for a predetermined period of time.

8. A method of operation of an anti-eavesdropping device, the anti-eavesdropping device being constructed of materials to minimize transmission of electromagnetic and/or audio signals from an exterior of the device to an interior of the device and from the interior of the device to the exterior of the device after the device is in a closed state, the method comprising:

transitioning the device from an open state to a closed state to minimize transmission of at least one of an electromagnetic signal or an audio signal from an interior of the device to an exterior of the device after the device is in a closed state;

minimizing, based on the construction of the device, reception of at least one of an electromagnetic signal or an audio signal from an exterior of the device to an interior of the device after the device is in a closed state; and supplying power to an electronic device in an interior of the device during a period when the device is in a closed state.

9. The method of claim 8, further comprising:

supplying power to the electronic device in an interior of the device during a period when the device is in an open state.

10. The method of claim 8, further comprising:

generating an alarm signal indicating that the device is in an open state during a period when the device is in an open state.

11. The method of claim 10, wherein the generation of the alarm signal occurs after the device has been in an open state for a predetermined period of time.

* * * * *